Feb. 2, 1960 R. J. ZELINKA 2,923,870

SEMICONDUCTOR DEVICES

Filed June 28, 1956

INVENTOR.
RICHARD J. ZELINKA

BY Orvin M. Haugen

ATTORNEY

United States Patent Office 2,923,870

Patented Feb. 2, 1960

2,923,870

SEMICONDUCTOR DEVICES

Richard J. Zelinka, Lino Lakes Village, Minn., assignor to Minneapolis-Honeywell Regulator Company, Minneapolis, Minn., a corporation of Delaware Application June 28, 1956, Serial No. 594,427

19 Claims. (Cl. 317—235)

The present invention relates to a tetrode type semiconductor amplifier, for example, a transistor tetrode amplifier, and more specifically to a composite tetrode transistor having input and output stages of amplification, these stages being situated on a single wafer of semiconductor substance and arranged in spaced relationship thereon. The present invention is an improvement over that disclosed in a copending application of Joseph T. Maupin, Serial No. 556,210, filed December 29, 1955, entitled "Semiconductor Devices" and assigned to the same assignee as the present invention.

In the electronic field today, there is a continuing demand for signal amplification devices which have a combination of high gain and good linearity, particularly at relatively large output currents. The semiconductor field has attempted to satisfy this need, however, until the present invention it has not been possible to completely fulfill this need with a single device or unit. The basic problem in semiconductor amplifiers wherein high current gain is desired is that the method utilized for increasing the various gains normally includes the addition of more units to the assembly. These additional units may be coupled together using inductance or resistance-capacitance coupling methods, which as is well known, limits the amplifier to dynamic or A.C. amplification only. Such a condition furthermore requires that each stage be inherently stable. Another possibility is the direct coupling of various stages of amplification, however, this method has not proved entirely satisfactory since a major problem is encountered in the leakage current occurring in the various stages of amplification. In this connection, the control of leakage current creates a particularly difficult problem in triode type semiconductor amplifiers since each stage of amplification normally amplifies the leakage current of the preceding stage as well as the signal obtained therefrom. When the leakage is thus multiplied, in the various stages of amplification, it is easily seen that high leakage finally results in the output circuit and can become the major portion of the output signal. It is possible to alleviate some of these difficulties through the use of direct coupled tetrode type transistors such as are disclosed in the aforementioned application of Joseph T. Maupin. The present invention involves a novel solution to the problem in that a plurality of amplification stages are prepared on a single wafer of semiconductor substance. Various features found in the semiconductor wafers which are utilized in the art make it desirable that these stages of amplification be prepared on a common base or wafer of semiconductor material.

According to the present invention, a semiconductor amplifier is provided on a single die of semiconductor material and includes a pair of emitter junction zones and a pair of collector junction zones, these junctions being arranged on the die in substantially oppositely disposed relationship so as to form a relatively narrow bridge area therebetween. In addition, a plurality of base electrodes are provided, one base electrode being situated on either side of an emitter-collector junction bridge area. Accordingly, appropriate bias voltages may be applied across the emitter-collector bridge in order to obtain the desired tetrode characteristics. Since semiconductor crystals are prepared in accordance with methods well known in the art today, such as by a vertical draw from a molten mass which produces a crystal having relatively low resistivity in the outer portions thereof and a relatively higher resistivity in the inner or central portions thereof, a two-stage amplifier may conveniently be prepared utilizing the innermost portions as the input stage of the amplifier and the outer portions thereof as the output stage. Since the output stage normally requires large current carrying capabilities, the relatively lower resistivity material found in this zone will be preferable to that relatively higher resistivity material found in the center portion of the crystal or die. Therefore, in other words, the input is provided with a high resistivity, low-leakage portion while the output is provided with a low resistivity zone of high current carrying ability. The gain which is obtained with the improved devices of the present invention provide advantages because of the proper geometrical arrangement. Larger areas for dissipation of heat from the collector are therefore available, this being a desirable feature also. The composite device is infinitely more stable than comparable devices or assemblies of devices utilized today having equally high gain characteristics. In addition, added components between stages of amplification are not necessary to stabilize the circuitry involved since multiple devices are not required.

The device of the present invention is also more desirable economically in that a single crystal and wafer is utilized for the preparation of the device and furthermore a single alloying procedure is utilized for a plurality of collectors and emitters, thereby producing more properly matched units.

It is therefore an object of the present invention to provide a composite tetrode-type transistor having improved stability and relatively high gain operation.

It is a further object of the present invention to provide a composite tetrode transistor amplifier having an input stage and an output stage of amplification, the input stage operating in a zone of relatively high resistivity material, and the output stage operating in a zone of relatively low resistivity material, said stages being fabricated upon a common die or wafer of semiconductor material.

It is still a further object of the present invention to provide a composite tetrode type transistor wherein the elements of the unit are formed in annular type of configuration.

Other and further objects of the present invention will become apparent to those skilled in the art upon a study of the following specification and claims along with the appended drawings, in which:

Figure 1:
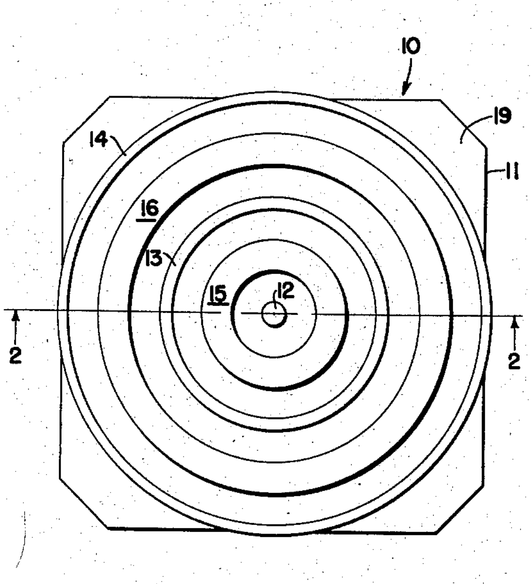
Figure 1 is a top plan view of a device prepared in accordance with the present invention including the various stages of amplification.

According to the preferred modification of the present invention, there is shown in Figure 1 a composite tetrode semiconductor device generally designated 10 which includes a die or wafer 11 of single crystalline semiconductor material such as germanium, silicon, or the like, and a plurality of low resistance or base electrodes 12, 13, and 14. The device further includes a plurality of junction zones which include a pair of emitters 15 and 16 and a pair of collectors 17 and 18. These junction zones are formed by alloying a significant impurity element into the semiconductor wafer such as it is indicated at 15*a*, 16*a*, 17*a*, and 18*a*. Significant impurities herein are intended to designate those impurities which induce n-type conductivity in the crystal, such as arsenic, antimony or bismuth, or p-type conductivity such as gallium, indium or aluminum. The wafer or die 11 is preferably prepared by the well-known vertical crystal-pulling technique wherein an elongated crystal is prepared by withdrawing material from a molten melt and freezing it upon withdrawal to form a single crystal or commonly oriented crystalline ingot, and preferably includes a significant impurity which is opposite in conductivity type to that utilized in preparation of the junction zones. Upon preparation of the ingot, the wafers or slabs, such as the wafer 11, are cut or sliced from the ingot and treated with appropriately chosen etching solutions and the like in order to prepare them for subsequent allowing operations and the like. These methods are well known in the art today and reference is made to U.S. Patents Nos. 2,576,267, 2,631,356, and 2,619,414 for a description of the crystal growing techniques and the etching solutions available and known in the art today. Upon drawing the crystalline ingot from the melt, it is normally found that a resistivity gradient appears across the ingot from the center portion to the outer periphery thereof. In this connection, a central portion of the ingot contains a lesser quantity of the significant impurity substance and hence is more highly resistive or in other words has a higher resistivity than the outer portion thereof which contains a higher concentration of the impurity. Since the outer portions of the crystal include a relatively larger quantity of impurity substance they are consequently of a lower resistivity than the central portion. For most purposes particularly where a high power device is proposed, a resistivity range for the input portion is preferable from about 6 to 12 ohm-centimeters, and a range for the output is preferable from about 4 to 7 ohm-centimeters.

Junctions are prepared in the semiconductor wafer by means of an alloy-fusion process as is commonly used in the art today. These junction zones are preferably prepared in substantially annular configuration and the emitter and collector elements are most suitably prepared in oppositely disposed relationship on the parallelly disposed major surfaces 19 and 20 of the wafer 11. In this connection, the wafer along with the alloy material to be fused therewith is subjected to a heat treatment wherein alloyed zones 15*a*, 16*a*, 17*a*, and 18*a* are formed adjacent the surfaces of the wafer 11. Between the oppositely disposed junction areas 15—17 and 16—18, respectively, there are formed relatively narrow bridge areas 22 and 23, respectively, these areas having a thickness dimension designated by the "*w*." It is essential for most practical operations, that the bridging areas 22 and 23 be of substantially uniform thickness "*w*" around the circumference of the zone. This provides for a more uniform distribution of the electrical field existing between the various low resistance base electrodes during operation. Stated another way, the desirable tetrode action in the transistor occurs when the bridge zones 22 and 23 are most uniform throughout their extent. For some applications, it may be desirable to form a single collector electrode, this electrode having an outer circumference about equal to that of member 18 as shown in Figures 1 and 2.

Figure 2:
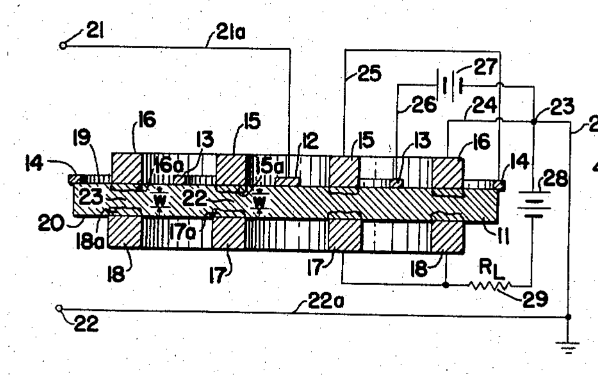
Figure 2 is a vertical sectional view taken along the lines and in the direction of the arrows 2—2 of Figure 1 and including a schematic showing of the associated circuitry utilized in conjunction with the device.

The arrangement of the two concentric transistors, one within the other, as shown in Figures 1 and 2, is especially well adapted for use as composite tetrode transistor in which the two units are so interconnected as to form a resultant composite four-terminal amplifying device having 2 stages of amplification. In Figure 2, connections have been disclosed which so interconnect the various electrodes so as to form such a composite amplifying device. The terminals 21 and 22 are adapted to be connected to a suitable source of input signal potential, not shown. The terminal 21 is connected by a conductor 21*a* to the input base electrode 12 of the inner transistor or input amplification stage which includes base electrode 12, emitter 15, collector 17, and the bias base electrode 13. The emitter 15 of the inner transistor is directly connected by a conductor 25 to the control base electrode 14 of the outer transistor or output amplification stage of the composite unit. The outer transistor includes the control base electrode 14, the emitter 16, the collector 18. The bias base electrode 13 is common between the inner and outer transistors. The emitter 16 is connected by a conductor 24 to a junction 23 and thence to ground by a conductor 22*b*. A bias potential 27 is applied between the emitter 16 and the bias base electrode 13, and is of a polarity to back-bias the emitter to base junction of both the inner and outer transistors. The collector electrodes 17 and 18 are directly interconnected and are connected to ground through a series circuit including a suitable load impedance 29 and an energizing source of potential 28, and thence to junction 23 and conductor 22*b*. The input electrode 22 is also connected to ground by a conductor 22*a*. The operation of the circuit is clearly apparent, the input circuit flowing in base electrode 12 causes an amplified emitter 15 and collector 17 current, the emitter current of the inner transistor being the input current of the outer unit to the base electrode connection 14, which, of course, causes an amplified output current from the collector 18, through the load device 29. The back bias applied to the base electrode 13 improves the linearity of the amplification of the device, this having been disclosed in detail in the copending application of Marshall et al. entitled "Transistor Circuit," Serial No. 572,983, filed March 21, 1956, and assigned to the same assignee as the present invention.

Figure 3:
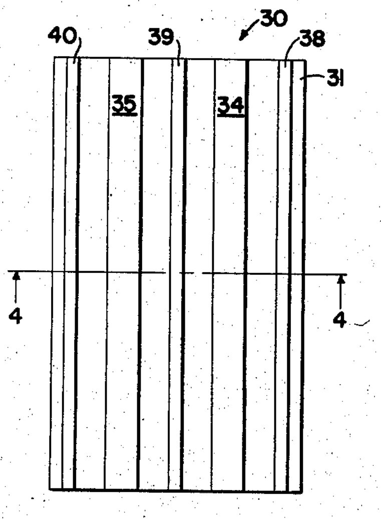
Figure 3 is a top plan view of a modified form of the present invention.
Figure 4:
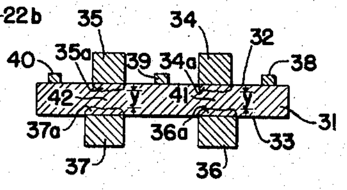
Figure 4 is a vertical sectional view taken along the lines and in the direction of the arrows 4—4 of Figure 3.

In a modified form of the present invention, a semiconductor amplifier 30 is provided which includes a semiconductor wafer 31 which may be of a semiconductor material such as germanium, silicon or the like. The wafer 31 is preferably prepared from a single crystalline or commonly oriented crystalline semiconductor material and includes a significant impurity to induce a desired type of conductivity such as n-type, p-type or the like. The wafer includes a pair of parallelly disposed major surfaces 32 and 33 upon which there are situated junction forming impurity bodies 34, 35, 36, and 37. Base or ohmic electrodes 38, 39, and 40 are also arranged on the surface of the wafer and are arranged to straddle the alloyed junction zones. The junction forming material is heat treated while in contact with the semiconductor wafer as was disclosed previously in order to form the junction zones adjacent the surface of the wafer such as 34*a*, 35*a*, 36*a*, and 37*a*, these zones cooperating to form relatively narrow bridge areas 41 and 42. These bridge zones have a thickness designated by the dimension "*y*" which is, of course, less than the thickness of the wafer 31. It will be noted that the junction zones formed by members 34—36 and members 35—37 are arranged in substantially oppositely disposed relationship on the wafer, thus providing a maximum breadth of bridge zones or sections 41 and 42. In operation, the device as is shown in Figures 3 and 4 is similar to that shown in Figures 1 and 2. If it is desirable to supply a device with a relatively high resistivity input stage and a relatively low resistivity output stage, it will be appreciated that the portion of the crystal being utilized as the input stage, for example, the portion adjacent the bridge area 41, be of relatively high resistivity material while the output stage which is found adjacent the bridge area 42 be of relatively lower resistivity material.

The various specific operations utilized in the preparation of the device illustrated in Figures 3 and 4 will be readily apparent to those skilled in the art, these operations being similar to those utilized in connection with the device illustrated in Figures 1 and 2.

*Example 1*

A specific example of preparation of a device such as is illustrated in Figures 1 and 2 follows. A germanium wafer grown by the horizontal crystal growing techniques well known in the art today was employed for the preparation of a single-crystalline ingot. A significant impurity was added to the melt in order to induce n-type conductivity in the grown crystal. In this connection, antimony may be successfully employed; it will be appreciated that other similar n-type conductivity inducing impurities may be utilized with success. The quantity of doping material utilizing was sufficient to provide for a resistivity in the range of from substantially 8–10 ohm centimeters in the central portion of the crystal while a resistivity of from 5 to 7 ohm centimeters is found in the outer periphery thereof. Upon selection of the proper wafer, the wafer blank was cut to a size of .75 inch square and lapped to a thickness of 17 mils whereupon the blank was etched in an etching solution such as disclosed in the Patent No. 2,619,414 to Heidenreich to a thickness of 8 mils. This etching solution is commonly known in the art today as CP–4 solution. The finished etched wafer was then treated in order to provide a desired junction zone adjacent to the surface thereof. In this operation, a significant impurity which induces a conductivity type opposite to that type found in the wafer 11 was placed in contact with the surface of the wafer, these bodies being the annular members 17 and 18 which form the collector junction zones in the amplifier member. In this connection, indium may satisfactorily be employed as an alloying material, this impurity inducing p-type conductivity in the alloyed area 17*a* and 18*a* adjacent the surface of the crystal wafer 11. Upon a heat treatment which includes raising the temperature to 925° F., maintaining that temperature for a period of 4 minutes and thence cooling to room temperature over a period of 15 minutes, the collector junctions were formed. They were .570 inch and .400 inch O.D., and .270 inch and .185 inch I.D. respectively. Utilizing a similar material, the emitter electrodes were then formed into the wafer 11, having .540 inch and .400 inch O.D. and .250 inch and .185 inch I.D. respectively. In this operation, the partially completed unit having the emitter impurity sources in contact with the wafer was then subjected to the heat treatment wherein the temperature was elevated to 875° F. and maintained at that level for a period of 4 minutes and thence cooled to room temperature over a period of 15 minutes. The previously described heat treatments were found to satisfactorily produce the alloyed zones 15*a*, 16*a*, 17*a*, and 18*a* in the wafer. Subsequent to the junction forming operation, suitable base electrodes such as those illustrated at 12, 13 and 14 in Figures 1 and 2 are attached to the semiconductor wafer by means of soldering with suitable materials. In this connection, the base electrodes preferably are formed of nickel or other material known to the art and are soldered to the wafer by means of lead-tin-antimony solder including 60% lead, 40% tin solder to which two percent of antimony has been added. Other materials known to the art may be utilized satisfactorily here. Following these steps in the preparation, suitable electrode leads are attached to the various electrodes of the device and the unit is encapsulated in a suitable enclosure. It is then ready for use.

Although various modifications of the present invention are disclosed in the specification herein, it will be understood that the illustrations are for purposes of clarifying the disclosure only and are not to be interpreted as any limitation on the scope of the present invention. Therefore, it will be appreciated that variations of the present invention will be apparent to those skilled in the art and may be utilized without departing from the spirit and scope of the present invention.

I claim as my invention:

1. A semiconductor amplifier including a wafer of substantially single crystalline semiconductor material having a pair of parallelly disposed major surfaces, a major portion of said wafer being of a first conductivity type and including a plurality of spaced junction areas of substantially opposite conductivity type, said junction areas being situated in oppositely disposed relationship on said major surfaces and defining at least two relatively spaced and thin bridge regions of said first conductivity type therebetween, a plurality of ohmic electrodes making contact with said wafer at points removed from said bridge regions and being situated on opposite sides of each of said bridge regions.

2. A semiconductor amplifier including a wafer of substantially single crystalline semiconductor material having a pair of parallelly disposed major surfaces, a major portion of said wafer being of a first conductivity type and including a plurality of junction areas of substantially opposite conductivity type, said junction areas being situated in oppositely disposed relationship on said major surfaces and defining two relatively spaced and thin bridge regions of said first conductivity type therebetween, three ohmic electrodes making contact with said wafer at points removed from said bridge regions and junctions and being situated on opposite sides of each of said bridge regions.

3. A semiconductor amplifier including a wafer of substantially single crystalline semiconductor material having a pair of parallelly disposed major surfaces, a major portion of said wafer being of a first conductivity type and including a plurality of junction areas of substantially opposite conductivity type, said junction areas being situated in oppositely disposed relationship on said major surfaces and defining at least two relatively spaced and thin bridge regions therebetween, a plurality of ohmic electrodes making contact with said wafer at points removed from said bridge regions and junctions and being situated on opposite sides of said bridge regions and junctions, said bridge regions extending continuously in a path between said ohmic electrodes.

4. A semiconductor amplifier including a wafer of substantially single crystalline semiconductor material having first and second parallelly disposed major surfaces, a major portion of said wafer being of a certain conductivity type and including a first ohmic electrode arranged on said first major surface thereof, a first plurality of relatively spaced junction areas on said first major surface, each being of substantially opposite conductivity type, having a substantially annular configuration and enclosing said first ohmic contact, at least one additional junction area being situated in substantially oppositely disposed relationship to said first junction areas on said second major surface and together with said first junction areas, defining at least two relatively spaced, annular and thin bridge regions of said certain conductivity type, and additional ohmic electrodes making contact with said wafer outwardly from each of said bridge regions.

5. A semiconductor amplifier including a wafer of substantially single crystalline semiconductor material taken from the class consisting of silicon and germanium and having first and second parallelly disposed major surfaces, a major portion of said wafer being of a certain conductivity type and having a resistivity gradient which decreases from a certain maximum level at a first zone to a lower level at a second zone removed therefrom, said first surface including an ohmic base electrode situated along said zone of maximum resistivity and a first plurality of junction areas of substantially opposite conductivity type situated in spaced relationship thereto and in zones of lower resistivity, said second major surface having a second plurality of junction areas being situated in oppositely disposed relationship to said first plurality of junction areas, and defining therewith at least two relatively spaced and thin bridge regions, and additional ohmic electrodes making contact with said wafer outwardly from each of said bridges, said ohmic electrodes being arranged in alternative disposed relationship with each of said bridge regions.

6. A semiconductor amplifier including a wafer of substantially single crystalline germanium having first and second parallelly disposed major surfaces, a major portion of said wafer being of a certain conductivity type and having a resistivity gradient which decreases from a certain maximum level at a first zone to a lower level at a second zone removed therefrom, said first surface having an ohmic electrode situated along said zone of maximum resistivity and a first plurality of junction areas of substantially opposite conductivity type situated in spaced relationship thereto and in zones of lower resistivity, said second major surface having a second plurality of junction areas situated in oppositely disposed relationship to said first plurality of junction zones, and defining therewith at least two relatively spaced and thin bridge regions, and additional ohmic electrodes making contact with said wafer at points removed from said bridges, said ohmic electrodes being arranged in alternative disposed relationship with each of said bridge regions.

7. A semiconductor amplifier including a wafer of substantially single crystalline semiconductor material having first and second parallelly disposed major surfaces, a major portion of said wafer being of a certain conductivity type and having a resistivity gradient which decreases from a certain maximum level at one zone to a lower level at a zone removed therefrom, said first surface including an ohmic base electrode situated adjacent said zone of maximum resistivity and a first plurality of junction areas of substantially opposite conductivity type situated in spaced relationship thereto and at least one of which is in said zone of lower resistivity, a second plurality of junction areas being situated on said second major surface in oppositely disposed relationship to said first plurality of junction zones, and defining therewith at least two relatively spaced and thin bridge regions, and a plurality of ohmic base electrodes making contact with said wafer at points removed from said bridges and being situated on opposite sides of said bridges.

8. A semiconductor amplifier including a wafer of substantially single crystalline semiconductor material having first and second parallelly disposed major surfaces, a major portion of said wafer being of a certain conductivity type and having a resistivity gradient which decreases from a certain maximum level at one zone to a lower level at a zone removed therefrom, said first surface including an ohmic base electrode situated adjacent said zone of maximum resistivity and a first plurality of junction areas of substantially opposite conductivity type situated in spaced relationship thereto and in zones of lower resistivity, at least one second junction area being situated on said second major surface in oppositely disposed relationship to said first plurality of junction zones, and defining therewith at least two relatively spaced and thin bridge regions at least one of which is in said zone of lower resistivity, and additional ohmic electrodes making contact with said wafer at points removed from said bridge regions and being situated on opposite sides thereof, said bridges extending continuously in a path between said ohmic base contacts.

9. A semiconductor amplifier including a wafer of substantially single crystalline semiconductor material, a major portion of which is of a certain conductivity type and having first and second parallelly disposed major surfaces, said first major surface including a first ohmic contact and a plurality of relatively spaced junction areas arranged thereon, said areas being of substantially opposite conductivity type and having a substantially annular configuration enclosing said first ohmic contact, a second plurality of junction areas of said opposite conductivity type being situated in substantially oppositely disposed relationship to said first junction areas on said second major surface and defining a plurality of relatively spaced and thin bridge regions of said certain conductivity type with said first junction areas, and additional ohmic contacts arranged on said wafer and enclosing said bridge regions.

10. A semiconductor amplifier including a wafer of substantially single crystalline semiconductor material taken from the class consisting of germanium and silicon, a major portion of said wafer being of a certain conductivity type and having a first and a second parallelly disposed major surface, said first major surface including a first ohmic contact and a plurality of relatively spaced junction areas arranged thereon, said areas being of substantially opposite conductivity type and having a substantially annular configuration enclosing said first ohmic contact, a second plurality of junction areas of said opposite conductivity type being situated in substantially oppositely disposed relationship to said first junction areas on said second major surface and defining a plurality of relatively spaced and thin bridge regions of said certain conductivity type with said first junction areas, and additional ohmic contacts arranged on said wafer and enclosing said bridge regions.

11. A semiconductor amplifier including a wafer of substantially single crystalline semiconductor material, a major portion of said wafer being of a certain conductivity type and having a first and a second parallelly disposed major surface, said first major surface including a first ohmic contact and an inner and an outer relatively spaced junction area arranged thereon, said areas being of substantially opposite conductivity type and having a substantially annular configuration enclosing said first ohmic contact, and at least one additional junction area of said opposite conductivity type being situated in substantially oppositely disposed relationship to said first junction areas on said second major surface and defining an inner and an outer thin bridge region of said certain conductivity type with said first inner and outer junction areas, and additional ohmic contacts arranged on said wafer and enclosing said bridge regions.

12. A semiconductor amplifier such as defined in claim 11 being further characterized in that said semiconductor material is selected from the class consisting of germanium and silicon.

13. A semiconductor amplifier including a wafer of substantially single crystalline semiconductor material, a major portion of said wafer being of a certain conductivity type and having a first and a second parallelly disposed major surface, said first major surface including a first ohmic contact and an inner and an outer relatively spaced junction area arranged thereon, said areas being of substantially opposite conductivity type and having a substantially annular configuration enclosing said first ohmic contact, second inner and outer junction areas of said opposite conductivity type being situated in substantially oppoistely disposed relationship to said first junction areas on said second major surface and defining an inner and an outer thin bridge region of said certain conductivity type with said first inner and outer junction areas, said inner bridge region being situated in an area of one resistivity value and said outer bridge region being situated in an area of a second resistivity value which is substantially different from said first resistivity value, and additional ohmic contacts arranged on said wafer and enclosing said bridge regions.

14. A semiconductor amplifier as defined in claim 13 being further characterized in that said semiconductor material is selected from the class consisting of germanium and silicon.

15. A semiconductor amplifier including a wafer of substantially single crystalline semiconductor material, a major portion of said wafer being of a certain conductivity type and having a first and a second parallelly disposed major surface, said first major surface including a first ohmic contact and an inner and an outer relatively spaced junction area arranged thereon, said areas being of substantially opposite conductivity type and having a substantially annular configuration enclosing said first ohmic contact, second inner and outer junction areas of said opposite conductivity type being situated in substantially oppositely disposed relationship to said first junction areas on said second major surface and defining an inner and an outer thin bridge region of said certain conductivity type with said first inner and outer junction areas, and an ohmic contact arranged outwardly from each of said bridge regions.

16. A semiconductor amplifier including a wafer of substantially single crystalline semiconductor material having a pair of parallelly disposed major surfaces, a major portion of said wafer being of a first conductivity type and including a first predetermined number of relatively spaced junction areas of substantially opposite conductivity type, said junction areas being situated in oppositely disposed relationship on said major surfaces and defining at least two thin bridge regions of said first conductivity type therebetween, and ohmic electrodes making contact with the major surfaces of said wafer at points removed from said bridge regions, said ohmic electrodes being positioned on either side of each of said bridge regions.

17. A semiconductor amplifier including a wafer of substantially single crystaline semiconductor material of a certain first conductivity type, said wafer having a pair of parallelly disposed major surfaces, and including a plurality of relatively spaced junction pairs having an opposite conductivity type and being arranged on said wafer to define a narrow bridge region therebetween, each of said pairs including two discrete junction zones which are situated in substantially oppositely disposed relationship on the major surfaces of said wafer, and a plurality of ohmic electrodes making contact with said wafer on opposite sides of each of said bridge regions.

18. A semiconductor amplifier including a wafer of substantially single crystalline semiconductor material having a pair of parallelly disposed major surfaces, a major portion of said wafer being of a first conductivity type and including a plurality of spaced junction areas of substantially opposite conductivity type, said junction areas being situated in oppositely disposed relationship on said major surfaces and defining at least two relatively spaced and thin bridge regions of said first conductivity type therebetween, a plurality of ohmic electrodes making contact with said wafer at points removed from said bridge regions, said ohmic electrodes being arranged in alternative disposed relationship with each of said bridge regions, and being positioned on opposite sides thereof.

19. A semiconductor amplifier including a wafer of substantially single crystalline semiconductor material having first and second parallelly disposed major surfaces, a major portion of said wafer being of a certain conductivity type and having a resistivity gradient which decreases from a certain maximum level at a first zone to a lower level at a second zone removed therefrom, said first surface having an ohmic electrode situated along said first zone of maximum resistivity and a first plurality of junction areas of substantially opposite conductivity type situated in spaced relationship to said base contact and in zones of relatively lower resistivity, said second major surface having a second plurality of junction areas of said opposite conductivity type in oppositely disposed relationship to said first plurality of junction zones and defining therewith at least two relatively spaced and thin bridge regions of said certain conductivity type, and additional ohmic electrodes making contact with said wafer outwardly from each of said bridge regions, said ohmic electrodes being arranged in alternative disposed relationship with each of said bridge regions.

References Cited in the file of this patent

UNITED STATES PATENTS

| | | |
|---|---|---|
| 2,672,528 | Shockley | Mar. 16, 1954 |
| 2,754,431 | Johnson | July 10, 1956 |
| 2,801,348 | Pankove | July 30, 1957 |